(12) United States Patent
Choi et al.

(10) Patent No.: US 9,153,763 B2
(45) Date of Patent: Oct. 6, 2015

(54) THERMOELECTRIC MATERIAL, METHOD FOR PREPARING THE SAME, AND THERMOELECTRIC MODULE INCLUDING THE SAME

(75) Inventors: Dong Hyeok Choi, Gyeonggi-do (KR); Sung Ho Lee, Gyeonggi-do (KR); Ju Hwan Yang, Gyeonggi-do (KR); Kang Heon Hur, Gyeonggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 83 days.

(21) Appl. No.: 13/450,090

(22) Filed: Apr. 18, 2012

(65) Prior Publication Data
US 2013/0068270 A1    Mar. 21, 2013

(30) Foreign Application Priority Data
Sep. 21, 2011    (KR) .................. 10-2011-0095318

(51) Int. Cl.
*H01L 35/16*    (2006.01)
*H01L 35/34*    (2006.01)
*H01L 35/26*    (2006.01)

(52) U.S. Cl.
CPC ............... *H01L 35/16* (2013.01); *H01L 35/26* (2013.01); *H01L 35/34* (2013.01); *Y10T 428/24975* (2015.01)

(58) Field of Classification Search
USPC .......... 136/200, 203, 205, 206, 224, 238, 240
See application file for complete search history.

(56) References Cited

U.S. PATENT DOCUMENTS 6,207,887 B1 *    3/2001    Bass et al. .................... 136/201
2005/0115601 A1 *    6/2005    Olsen et al. .................. 136/212

FOREIGN PATENT DOCUMENTS

JP    2007-067163    3/2007
KR    10-2002-0096491    12/2002

OTHER PUBLICATIONS

Kadel et al. "Synthesis and Thermoelectric Properties of Bi2Se3 Nanostructures" Nanoscale Res Lett 2011, 6:57 published: Oct. 1, 2010.*

* cited by examiner

*Primary Examiner* — Susan D Leong
(74) *Attorney, Agent, or Firm* — McDermott Will & Emery LLP

(57) ABSTRACT

Disclosed herein is a thermoelectric material having a plate type layered structure where each layer has a thickness of 30 nm or less, a method for preparing the same, and a thermoelectric module using the same.

According to the present invention, as for a thermoelectric material having a nanometer-sized layered structure, crystallinity of each layer is excellent, electric conductivity of electron is improved, and phonon diffraction is induced at a grain interface between layers, and thus, a thermoelectric module having excellent thermoelectric properties can be provided.

8 Claims, 4 Drawing Sheets

- PRIOR ART -

- PRIOR ART -

THERMOELECTRIC MATERIAL, METHOD FOR PREPARING THE SAME, AND THERMOELECTRIC MODULE INCLUDING THE SAME

CROSS REFERENCE(S) TO RELATED APPLICATIONS

This application claims the benefit under 35 U.S.C. Section 119 of Korean Patent Application Serial No. 10-2011-0095318, entitled "Thermoelectric Material, Method for Preparing the Same, and Thermoelectric Module Including the Same" filed on Sep. 21, 2011, which is hereby incorporated by reference in its entirety into this application.

BACKGROUND OF THE INVENTION

1. Technical Field

The present invention relates to a thermoelectric material, a method for preparing the same, and a thermoelectric module including the same.

2. Description of the Related Art

A rapid increase in use of fossil energy may cause global warming and energy depletion. Recently, programs relating to reproducible energy development and thermoelectric device development have actively progressed all over the world, including Korea, in order to address these problems. Particularly, since all equipment and electronic instruments do not overcome the limitations of Carnot cycle thermodynamically, waste heat makes up a majority of input energy. Therefore, it is preferable to reuse heat energy and apply it to a new field in order to overcome the energy crisis.

Thermoelectric devices and modules are largely divided into an electricity generation field using Seebeck effect and a cooling field using Peltier effect. In the cooling field, dissipation of heat is becoming increased due to smallness, high power consumption, high integration, and slimness of electronic parts in addition to development of IT industries, and the heat serves as an important factor that causes malfunction and decrease in efficiency of the electronic instruments.

A thermoelectric device is used in order to solve these problems, and future applicability of the thermoelectric device will be further enlarged, considering advantages of the thermoelectric device such as non-noise, high cooling rate, local cooling, and eco-friendly features.

Also in thermoelectric generation field, many efforts to regenerate electric energy by using a large quantity of waste heat discharged from vehicles, waste incinerators, steelworks, power plants, geothermal heat, electronic instruments, body heat, or the like has been made throughout the world. Particularly, thermoelectricity generation is bulk electricity generation, and can be fused into other electricity generation, and thus future applicability thereof is very high. Further, thermoelectricity generation does not cause earth polluting materials while generating electric energy, and thus it is consistent with eco-friendly features. Therefore, the propagation rate of thermoelectricity generation will be accelerated.

However, commercialization of thermoelectric cooling and thermoelectricity generation are not common throughout the world, and studies have been conducted only at a national laboratory or an academic laboratory. However, the thermoelectric devices and modules have been further studied in order to solve a recent increase in energy cost and environmental problems. Therefore, a future market thereof will be enlarged considering applicability thereof.

FIG. 1 shows a structure of a module part of a thermoelectric device excluding a power source part, which is currently used. A thermoelectric device largely employs a N-type semiconductor 11 and a P-type semiconductor 12, and further consists of a metal electrode 13 connecting the N-type semiconductor 11 and the P-type semiconductor 12, and a ceramic substrate 14, which is called a single module.

In order to allow the single module to be used as a cooling device or an electricity generator device, charges are generated in the N-type semiconductor 11 and the P-type semiconductor 12, and then respective terminals therefore need to be connected to a circuit by metal electrodes 13.

Therefore, in order to increase efficiency of the single module, the module needs to be designed such that respective components constituting the module have high efficiency, and mutual efficiency between the respective components is at the optimum. However, due to low conversion efficiency of the single module, there is a need of employing a composite module using several single modules, in an applicable field of thermoelectric module.

The conventional composite module is manufactured by connecting single modules of p-n constitution in series according to the working condition. Respective single modules are connected by the metal electrode, and the metal electrode is connected to the ceramic substrate. Since the respective single modules are designed to be parallel with each other from a heat source, the temperature gradient of semiconductor material per se is equal between the single modules.

This existing series connection type module structure has problems with respect to disconnection of circuit, and has a fatal risk that the composite module can not be operated overall when any one of the single modules constituting the composite module breaks down. Further, this series connection type module has a large disadvantage in that voltage dependence is large.

Meanwhile, the thermoelectric material of the related art was synthesized by ingot growing or mechanical alloying. The thermoelectric material prepared as above, as shown in FIG. 2, has a structure in which particles each have a size of several µm and a spherical shape and they are randomly distributed without a certain rule.

Recent studies on the thermoelectric material are proceeding in a direction of reducing heat conductivity due to phonon scattering. For this phonon scattering, the size of the thermoelectric material needs to be smaller than wavelength of the phonon, but generally, it has a size of several tens of µm.

Therefore, many developers attempt to synthesize a nanometer-sized material capable of inducing phonon scattering to reduce heat conductivity, but the results have not been sufficient until now.

SUMMARY OF THE INVENTION

An object of the present invention is to provide a thermoelectric material capable of maximizing performance of the thermoelectric device by changing the structure of the thermoelectric material used for a thermoelectric device to reduce heat conductivity of the thermoelectric material.

Another object of the present invention is to provide a method for preparing the thermoelectric material.

Still another object of the present invention is to provide a thermoelectric module including the thermoelectric material as a thermoelectric device.

According to one exemplary embodiment of the present invention, there is provided a thermoelectric material having a plate type layered structure where each layer has a thickness of 30 nm or less.

The thermoelectric material may be represented by $A_2B_3$, wherein A is at least one element selected from Bi and Sb, and B is at least one element selected from Se and Te.

Each layer of the plate type layered structure may be aligned in a C-axial direction.

According to another exemplary embodiment of the present invention, there is provided a method for preparing a thermoelectric material, including: sealing a raw material in vacuum condition; dissolving the sealed material; and rapidly cooling the dissolved material at a temperature of 0° C. or lower.

The sealing of the raw material may be performed at a vacuum degree of $1.0 \times 10^{-3}$ to $1.0 \times 10^{-6}$ torr.

The dissolving of the sealed material may be performed at a temperature of 600 to 700° C.

The rapidly cooling may be performed for 1 to 20 seconds.

According to still another exemplary embodiment of the present invention, there is provided a thermoelectric module including the thermoelectric material.

DESCRIPTION OF THE PREFERRED EMBODIMENTS

Figure 1:
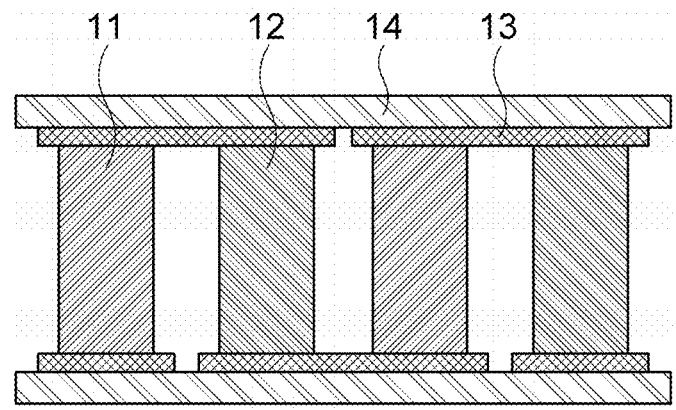
FIG. 1 shows a structure of a commercialized thermoelectric module.
Figure 2:
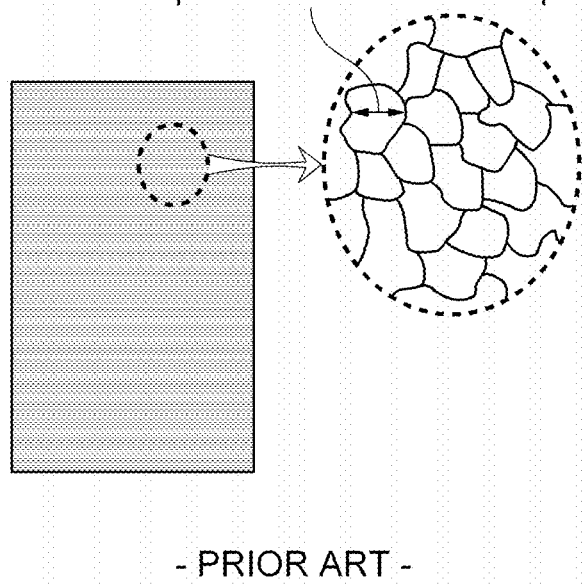
FIG. 2 shows a fine structure of a thermoelectric material according to the related art.
Figure 3:
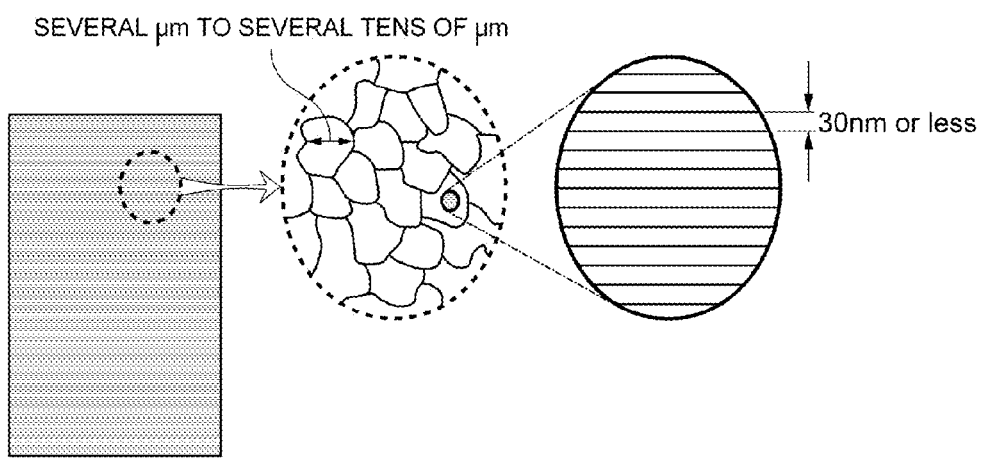
FIG. 3 shows a fine structure of a thermoelectric material having a layered structure according to the present invention.

Hereafter, preferred embodiments of the present invention will be described in detail with reference to the accompanying drawings.

Terms used in the present specification are for explaining the embodiments rather than limiting the present invention. As used herein, unless explicitly described to the contrary, a singular form includes a plural form in the present specification. Also, as used herein, the word "comprise" and/or "comprising" will be understood to imply the inclusion of stated constituents, steps, operations and/or elements but not the exclusion of any other constituents, steps, operations and/or elements.

The present invention is directed to a thermoelectric material having a new structure, a method for preparing the same, and a thermoelectric module including the same.

The thermoelectric material according to the present invention is characterized by having a plate type layered structure where each layer has a thickness of 30 nm or less.

The thermoelectric material of the present invention has a spherical structure without crystals, but has a plate type structure having crystallinity in a predetermined direction, preferably, a C-axial direction (thickness direction) and containing layers with a thickness of about 30 nm laminated therein.

As for the thermoelectric material having the layered structure according to the present invention, if each layer has a thickness of above 30 nm, the layer is larger than a wavelength of phonon for phonon scattering, with the result that the reduction effect in heat conductivity due to phonon scattering is decreased.

The thermoelectric material according to the present invention is represented by $A_2B_3$, wherein A is at least one element selected from Bi and Sb and B is at least one element selected from Se and Te. Further, the thermoelectric material may be used for both a P-type semiconductor and an N-type semiconductor.

Specific examples of the thermoelectric material may include $Sb_2Te_3$, $Bi_2Se_3$, $Bi_2Te_3$ or the like, but are not particularly limited thereto.

The thermoelectric material having a plate type layered structure according to the present invention may be prepared by sealing a raw material in vacuum condition; dissolving the sealed material; and rapidly cooling the dissolved material at a temperature of 0° C. or lower.

First, a raw material for a P-type or N-type semiconductor is sealed in a condition where a predetermined degree of vacuum is kept. In the present invention, the sealing of the raw material is performed by weighing a predetermined quantity of raw material powder, putting it in a quartz tube, vacuumizing the quartz tube using a vacuum pump, putting a predetermined quantity of hydrogen therein, and maintaining the state of the quartz tube at a predetermined temperature for a predetermined time.

Here, a vacuum degree of $1.0 \times 10^{-3} \sim 1.0 \times 10^{-6}$ torr is preferably kept.

Secondly, the sealed raw material is put and dissolved in a furnace. The dissolving of the raw material may be performed at a temperature of 600 to 700□, at which the raw material can be dissolved. In the dissolving of the raw material, respective dopants may be added into P-type and N-type semiconductor materials, and the kinds of dopants added are not particularly limited.

Finally, the dissolved raw material is rapidly cooled at a temperature of 0□ or lower, and preferably, −196 to −10□. The time for the rapidly cooling is 1 to 20 seconds, and thus, a thermoelectric material, which has a layered structure with excellent crystallinity by rapidly coagulating the dissolved raw material, can be prepared for a very short time. Further, a distance between layers is about 30 nm or less, and thereby a thermoelectric material having fine crystallinity can be prepared.

Also, the present invention can provide a thermoelectric module using the prepared thermoelectric material as a thermoelectric device. That is to say, the thermoelectric module can be manufactured by mounting a plurality of thermoelectric devices using the thermoelectric material on a substrate, which is made of an insulating material such as ceramics or the like, and in which electrodes are formed on a surface thereof.

The thermoelectric device mounted in the thermoelectric module may be manufactured by using a thermoelectric material prepared by rapid cooling, and here the thermoelectric material has a plate type layered structure where each layer has a thickness of 30 nm. This thermoelectric material is used to improve conductivity due to phonon scattering, with the result that a thermoelectric module having excellent thermoelectric properties can be manufactured.

Hereinafter, the present invention will be described in detail with reference to the Example. Examples of the present invention are provided in order to more completely explain the present invention to those skilled in the art. The following examples may be modified in several different forms and do not limit the scope of the present invention. Rather, these examples are provided in order to make this disclosure more thorough and complete, and completely transfer ideas of the present invention to those skilled in the art.

EXAMPLE $Bi_2Te_3$ was weighed as a material for P-type and N-type semiconductors, and sealed within a quartz tube in the vacuum condition. Here, a vacuum degree of the quartz tube was kept at $1.0 \times 10^{-6}$ torr.

The material was dissolved in a furnace at 700□, and then put in liquid nitrogen of −196□ to be rapidly cooled for 10 seconds, thereby preparing a thermoelectric material.

COMPARATIVE EXAMPLE

For the Comparative Example, a thermoelectric material of $Bi_2Te_3$ was prepared by using the conventional mechanical alloying.

Experimental Example 1

Determination of Structure

Figure 4:
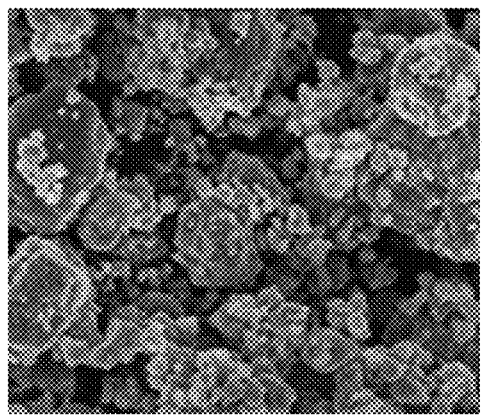
FIG. 4 is a scanning electron microscope picture of a thermoelectric material prepared according to Comparative Example.
Figure 5A:
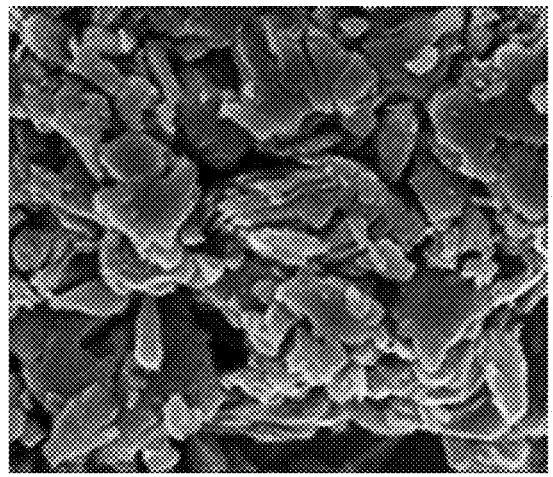
FIGS. 5A and 5B are scanning electron microscope pictures of thermoelectric materials prepared according to the Examples.
Figure 5B:
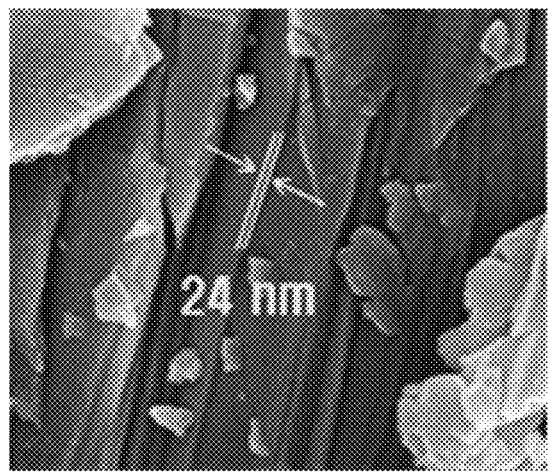

Structures of the thermoelectric materials prepared according to the comparative example and the example were measured by using a scanning electron microscope, and the results are shown in FIGS. 4 and 5A and 5B.

Next, as shown in FIG. 4, it can be seen that the thermoelectric material prepared by the conventional mechanical alloying showed a particle size of several μm, a large particle distribution, spherical-shaped or random-shaped particles.

However, it can be confirmed from FIGS. 5A and 5B that, in the thermoelectric material prepared by the method of the present invention, each particle has a plate type layered structure (FIG. 5A), and as the result of enlargement of this, each layer of the plate type layered structure has a thickness of about 24 nm (FIG. 5B).

Experimental Example 2

Confirmation of Crystallinity

Figure 6:
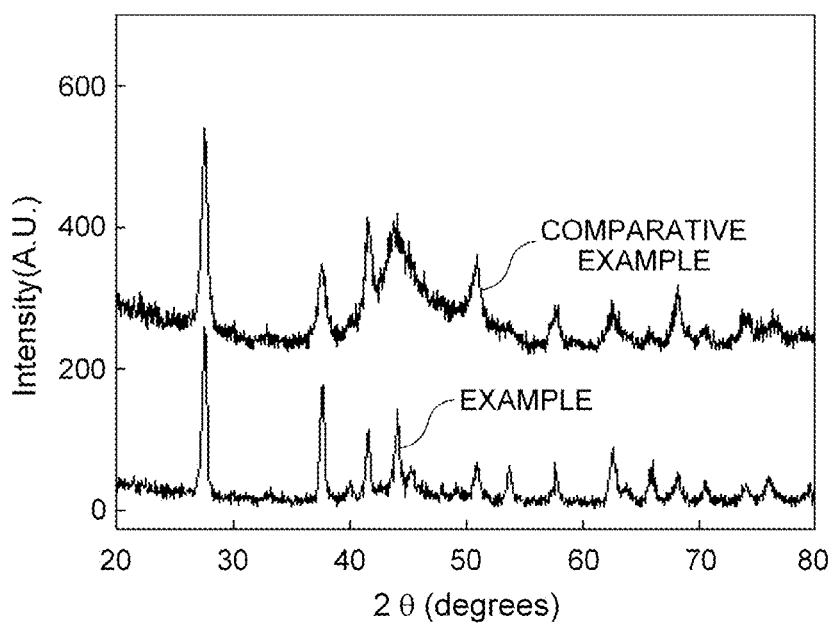
FIG. 6 shows results obtained by measuring (XRD) crystallinity of the thermoelectric materials prepared according to the Comparative Example and Examples.

The crystallinity of the thermoelectric materials prepared according to the comparative example and the example were measured by XRD, and the results are shown in FIG. 6.

The results of FIG. 6 confirmed that the thermoelectric material prepared by the method of the present invention has superior crystallinity. As such, the thermoelectric material of the present invention synthesized by rapid solidification was observed to have a nano type layered structure through the SEM measurement result, and confirmed to have excellent crystallinity through XRD measurement. It can be seen that from these results that layers of several μm constitute each nanoparticle and each layer has an improved crystallinity, within the particle of the thermoelectric material.

As such, the thermoelectric material prepared according to the present invention has a nano type layered structure where each layer has a thickness of 30 nm or less, and thus, it can be estimated that electric conductivity is improved through phonon scattering. Also, a thermoelectric module using this thermoelectric material can exhibit superior thermoelectric properties to the thermoelectric material used in the thermoelectric module of the related art.

According to the present invention, as for a thermoelectric material having a nanometer-sized layered structure, crystallinity of each layer is excellent, electric conductivity of electron is improved, and phonon diffraction is induced at a grain interface between layers, and thus, a thermoelectric module having excellent thermoelectric properties can be provided.

While the present invention has been shown and described in connection with the embodiments, it will be apparent to those skilled in the art that modifications and variations can be made without departing from the spirit and scope of the invention as defined by the appended claims.

What is claimed is:

1. A thermoelectric material comprising nano-particles, each nano-particle comprising a plurality of plate type layers where each layer has a thickness of 30 nm or less and grain shape of the particles forms a layered structure.

2. The thermoelectric material according to claim 1, wherein the thermoelectric material comprises $A_2B_3$, wherein A is at least one element selected from Bi and Sb, and B is at least one element selected from Se and Te.

3. The thermoelectric material according to claim 1, wherein each layer of the plate type layered structure is aligned in a C-axial direction.

4. A method for preparing the thermoelectric material according to claim 1, comprising:
   sealing a raw material in vacuum condition;
   dissolving the sealed material; and
   rapidly cooling the dissolved material at a temperature of 0° C. or lower.

5. The thermoelectric material according to claim 4, wherein the sealing of the raw material is performed at a vacuum degree of $1.0 \times 10^{-3}$ to $1.0 \times 10^{-6}$ torr.

6. The thermoelectric material according to claim 4, wherein the dissolving of the sealed material is performed at a temperature of 600 to 700° C.

7. The thermoelectric material according to claim 4, wherein the rapidly cooling is performed for 1 to 20 seconds.

8. A thermoelectric module comprising the thermoelectric material according to claim 1.

* * * * *